US005658382A

United States Patent [19]

Lindblad

[11] Patent Number: 5,658,382

[45] Date of Patent: Aug. 19, 1997

[54] ARRANGEMENT FOR PAINTING AN EXTENDED OBJECT CONTINUOUSLY IN ITS LONGITUDINAL DIRECTION

[76] Inventor: Anders Lindblad, Skrantabacken 16 D, 691 42 Karlskoga, Sweden

[21] Appl. No.: 571,371

[22] Filed: Dec. 13, 1995

Related U.S. Application Data

[63] Continuation-in-part of Ser. No. 211,540, Apr. 15, 1994, abandoned.

[30] Foreign Application Priority Data

Oct. 17, 1991 [SE] Sweden ........................ 91 03019

[51] Int. Cl.[6] ........................ C23C 14/00

[52] U.S. Cl. ........................ 118/50; 118/35; 118/642; 118/58; 118/64; 118/66; 118/405; 118/429

[58] Field of Search ........................ 118/35, 50, 642, 118/58, 64, 66, 405, 429; 427/294, 297

[56] References Cited

U.S. PATENT DOCUMENTS

| | | | |
|---|---|---|---|
| 3,745,971 | 7/1973 | Stony | 118/50 |
| 4,333,417 | 6/1982 | Camp et al. | 118/50 |
| 4,390,564 | 6/1983 | Kimble | 118/643 |

*Primary Examiner*—Laura Edwards

*Attorney, Agent, or Firm*—Dennison, Meserole, Pollack & Scheiner

[57] ABSTRACT

An arrangement for painting all sides of an elongated rigid object comprises a closed container containing in its bottom portion a paint mixture of binder, monomer and pigment. The elongated object passes through the closed container above the surface of the paint mixture to be coated on all sides by the paint mixture, followed by passage through an apparatus for drying the bottom surface of the object. The object is freely suspended while passing through the closed container and the drying apparatus for the bottom surface, and then is passed to a drying apparatus for the top surface of the object.

10 Claims, 2 Drawing Sheets

ARRANGEMENT FOR PAINTING AN EXTENDED OBJECT CONTINUOUSLY IN ITS LONGITUDINAL DIRECTION

This application is a continuation in part of U.S. application Ser. No. 08/211,540 filed Apr. 15, 1994, now abandoned.

BACKGROUND OF THE INVENTION

The present invention relates to an arrangement for painting all sides of extended objects, these objects possibly having different cross sections. Such objects have previously been painted by being placed on a conveyor and painted on all sides except the side in contact with the conveyor. The painted objects were then dried by means of ultraviolet radiation, for instance. When dry, the objects were turned over and painted on the remaining, unpainted side. The disadvantage of this method is that it takes too long to paint extended objects on all sides, and also that special apparatus is needed to turn the objects ready for painting on the surface initially serving as contact surface. Another disadvantage is that paint containing solvent is used, which is unsatisfactory from the environmental aspect.

SUMMARY OF THE INVENTION

The object of the invention is to increase the production rate during painting. This is enabled by painting on all sides, the part to be painted and dried being freely suspended and not in contact with any support surface. Guiding the part behind the portion being painted allows the latter to remain freely suspended during painting and while being transported for drying. The drying process can be shortened if very quick-drying paint is used, such as a mixture of binder and monomers that may also contain color pigment. Such a mixture dries extremely quickly if it is subjected to radiation energy so that polymerization occurs. Drying occurs extremely quickly if the painted surface is radiated with the aid of an electron beam.

Painting is suitably performed by allowing the extended object to pass through a closed tank containing the desired paint mixture. The extended object is moved along above the surface of the mixture. Above the surface of the mixture the tank is subjected to a vacuum so that paint from the liquid surface surrounds the portion of the extended object located in the tank. The painted portion then passes two polymerization units, one of which polymerizes the painted surface from below and the other which polymerizes the painted surface from above. The two units are displaced in relation to each other so that electronic irradiation is performed first from below and then, after a short delay, from above.

The use of a paint mixture consisting solely of binder, monomer and possibly color pigment (i.e. solvent-free), avoids the drawbacks arising out of the use of solvent.

The painted surfaces can pass another drying means where they are dried with the aid of ultraviolet light.

The ready-painted objects may be packed, for instance, in bundles, parcels or the like.

Blanks having rectangular cross section are used for the extended objects, the cross section being sufficiently large to encompass at least two extended objects arranged side by side. Such a blank is machined so that a number of adjacent extended objects are obtained, the objects being held together in pairs by means of a blank remnant.

The use of blanks as described above offers the advantage that several extended objects can be fed along beside each other. Instead of only one extended object, a plurality of extended objects located beside each other is obtained, thus increasing the production rate as compared with single objects by the number of blanks lying parallel. These blank remnants are removed immediately prior to painting.

A blank for machining several extended objects is obtained from a stack of similar blanks where the blanks in the stack are arranged one after the other. A stack of blanks is obtained by sawing one stack at a time from a stack of slabs.

The slabs may be produced from optional material such as wood, fiberboard, plastic or metal.

Equipment for treating the surface of the extended objects may be arranged along the production line to roughen the surfaces, thereby improving the durability of the finished paintwork.

A painting station for priming may also be arranged in the production line, in this case at a point after a number of extended objects disposed side by side have been obtained. The priming station may function similarly to the painting station described above, i.e. the objects are painted on all sides. Here, too, the paint may comprise the same type of mixture as used for painting. However, normally it is sufficient for the extended objects to be painted from above and subsequently dried by means of ultraviolet radiation.

The installation described above greatly increases the manufacturing capacity as compared with known methods, thanks both to the use of a quick-drying paint and to several objects being moved along in parallel.

BRIEF DESCRIPTION OF THE DRAWINGS

One embodiment of the invention will be described by way of example with reference to the accompanying drawing Figures, in which.

DESCRIPTION OF THE PREFERRED EMBODIMENTS

Figure 1:
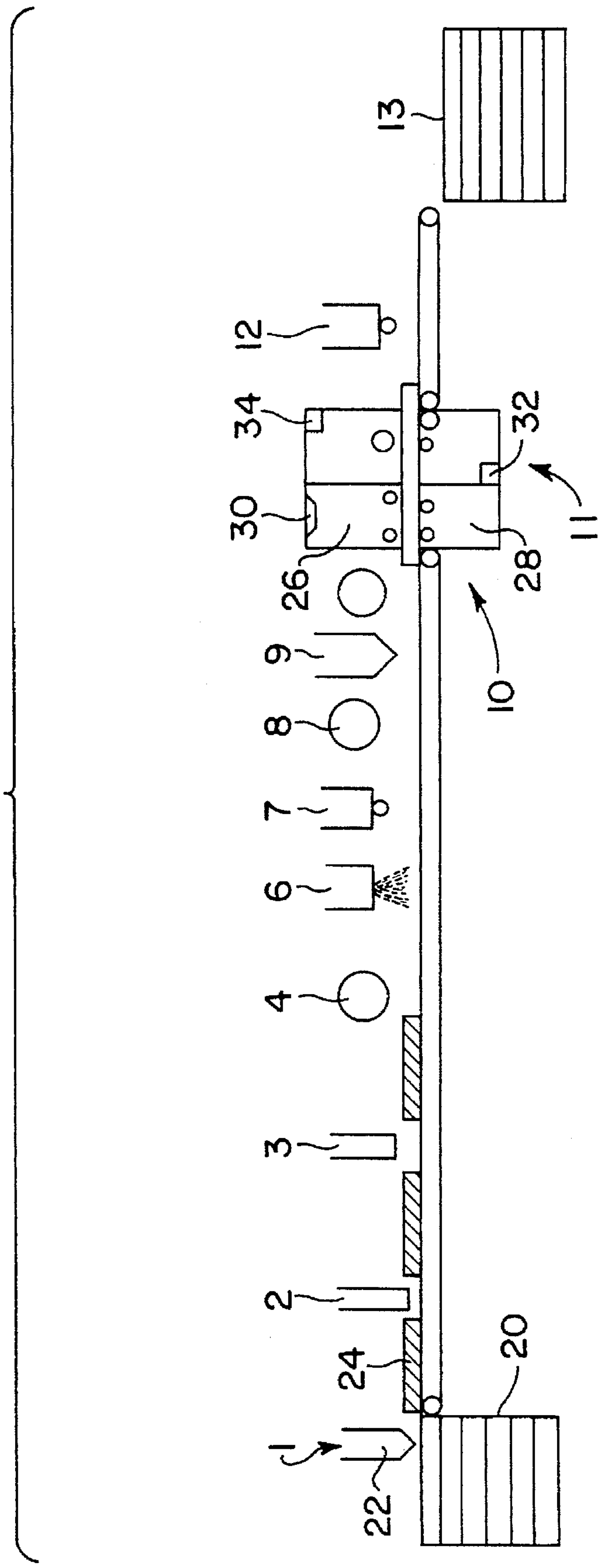
FIG. 1 is a schematic diagram of the arrangement of the invention.

According to FIG. 1, a number of slabs 20 stacked one on top of another, possibly having an area in excess of 1 $m^2$ are supplied to sawing unit 1. From this stack of slabs, one stack of blanks at a time is sawn off with a stock saw 22, and with a rectangular cross section each blank in the stack is in the nature of a plank 24. One stack of blanks at a time is supplied to a separating unit 2 where the individual blanks in the stack are arranged one after another. The blanks are then supplied from separating unit 2 to a working-up unit 3 where each blank is machined mechanically by milling, for example, so that a number or parallel extended objects are obtained, two adjacent objects being joined together by means of blank remnants. A blank with more than two extended objects is supplied to a unit 4 where each blank is roughened by sandpapering, for example, to prepare it for a first coat of paint. After treatment in unit 4, the blank is supplied to a priming station 6 where it is painted from above by spray painting, for example; the blank is subsequently subjected to drying by means of ultraviolet light in unit 7. A suitable paint for priming the blank which is supplied by priming station 6 comprises a binder, monomer and possibly color pigment and photo-initiator.

The primed blank is supplied to a roughening unit 8 for roughening, such as with sandpaper. After treatment in unit 8, the blank is ready for more painting. The blank is then conveyed to a unit 9 where the extended objects are separated from one another by means of milling, for example, and from unit 9, the separated, extended objects are supplied to a painting unit 10 comprising a closed container 26 having in its bottom portion a mixture 28 of binder, monomer and possibly color pigment. The portions of the extended objects located inside the closed tank are guided in such a manner as to be freely suspended above the surface of the paint mixture, allowing painting on all sides. The closed container includes a means 30 for drawing a vacuum so that paint is drawn up from the surface towards the portions of the objects located therein. The extended objects, painted on all sides and still freely suspended, are conveyed to a drying unit 11 containing two electron accelerators, an accelerator 32 operating from below and an accelerator 34 operating from above. Drying the paint with electron accelerators is described in detail in a publication from Polymer-Physik GmbH, entitled "Hintergrund und Neueste Anwendungen von Elektronenbestrahlungsaniagen fur umwelttreundlich Beschichtungs-und Laminier-Technologien." Since painted portions of the extended objects in the drying unit 11 should be dried so that the front parts can come into contact with a support surface without paint being damaged, drying is initiated from below and continued after a short delay from above. Since the paint used comprises a binder, monomer and possibly color pigment, the electron beams will polymerize the coated paint, resulting in instantaneous drying. The painted and dried extended objects are supplied from unit 11 to a second drying unit 12 where they are dried only from above with the aid of ultraviolet light. From unit 12, the painted and dried extended objects are passed to a packing unit 13.

Priming unit 6 as shown in the Figure is a spray type painting unit, but could be a vacuum painting unit similar to painting unit 10. Similarly, painting unit 10 may be replaced with a spray painting unit.

The extended object blanks are fed continuously along the entire production line.

Figure 2:
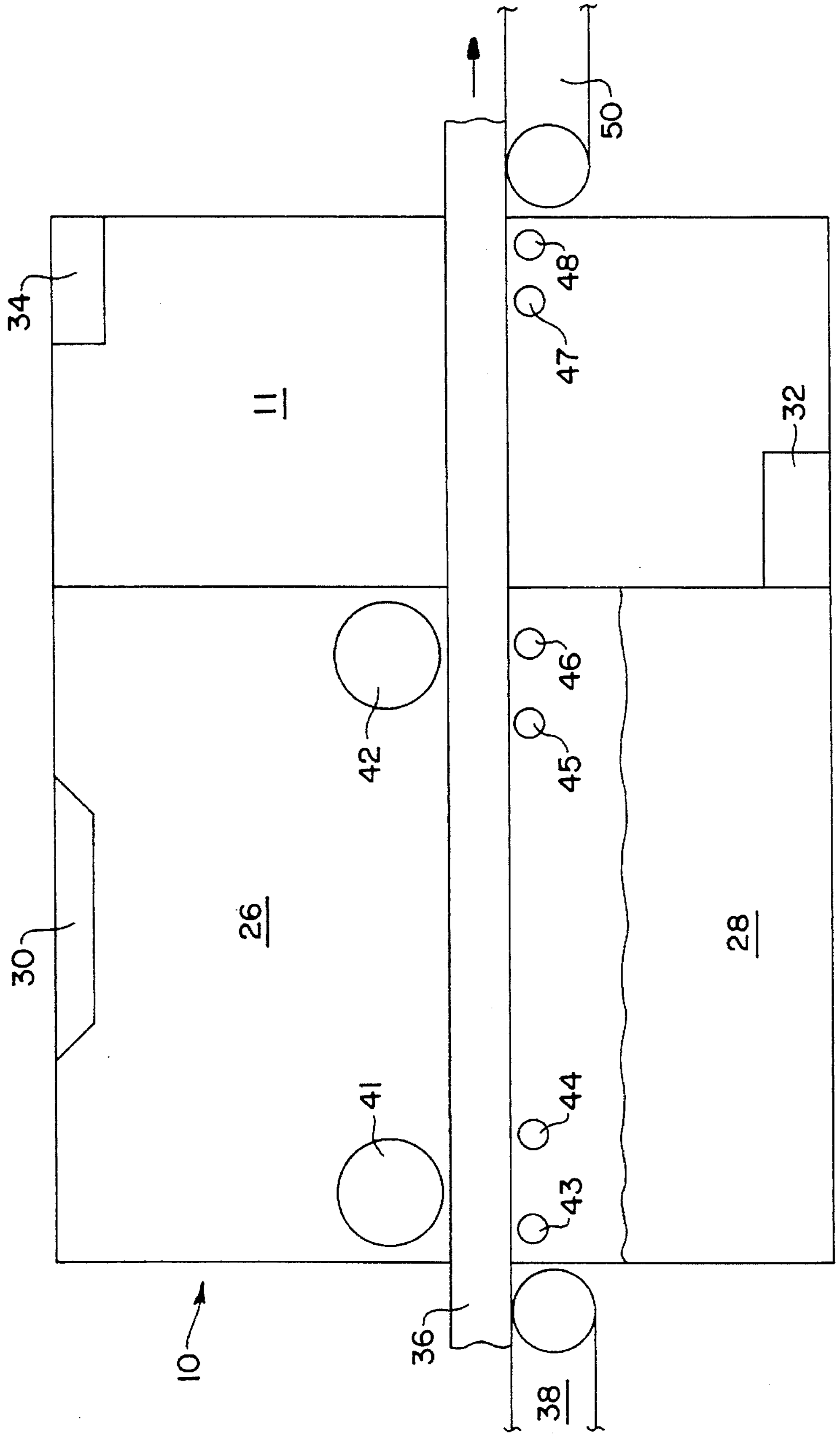
FIG. 2 is a schematic cross-sectional diagram of the painting and drying stations of FIG. 1.

The painting station 10 and drying station 11 are shown in greater detail in FIG. 2, in which a primed and roughened blank 36 is passed on conveyor 38 to painting station 10. In painting station 10 the blank is no longer supported from below by the conveyor, but is pressed between upper rubber rollers 41 and 42 and lower, smaller stainless steel bars 43, 44, 45 and 46. In this case, the upper rollers have a diameter of about 50 mm and the lower bars have a diameter of about 6 mm. Because of the absence of a supporting surface provided by a conveyor, the blank is considered to be "freely suspended."

The painted blank passes into drying unit 11, where it is immediately dried from below by electron accelerator 32. At the opposite end of the drying unit 11, blank 36 rests on stainless steel bars 47 and 48, while it is dried from above by electron accelerator 34. At the exit of drying unit 11, blank 36 which has been dried from above and below passes onto conveyor 50.

What is claimed is:

1. An arrangement for painting all sides of an elongated rigid object having an upper surface and a lower surface, the arrangement comprising:

a) means for moving the object in a longitudinal direction;

b) a closed container, containing in a bottom portion thereof a paint mixture of binder, monomer and pigment having an upper surface, and a passage means for disposing the object above the upper surface of the mixture;

c) means for coating the object disposed above the upper surface with the paint mixture comprising vacuum means connected to the container disposed above the surface of the mixture for drawing paint mixture up from the upper surface to the object;

d) first irradiation means located downstream of said closed container, arranged for polymerizing and drying the paint mixture on the lower surface of the object;

e) second irradiation means for polymerizing and drying the paint mixture on the upper surface of the object and located downstream of the first irradiating means;

f) guide means for freely suspending the object passing through the container and the first irradiating means, g) means for supporting the object from below located downstream of the second irradiation means; and h) third irradiation means disposed above the means for supporting the object from below, for irradiating the upper surface of the object.

2. An arrangement according to claim 1, wherein the first and second irradiating means comprise means for providing an electron beam or curtain.

3. An arrangement according to claim 1, additionally comprising means for packing the objects downstream of the second drying means.

4. An arrangement according to claim 1, wherein the third irradiating means comprises means for exposing the object to UV radiation.

5. An arrangement according to claim 1, additionally comprising a priming station located upstream of said container.

6. An arrangement according to claim 5, additionally comprising a means for exposing the object to UV radiation, located between said priming station and said container.

7. An arrangement according to claim 5, additionally comprising a work-up station upstream of said priming station, said work-up station arranged for receiving blanks and converting the blanks to the object.

8. An arrangement according to claim 7, additionally comprising a separating station upstream of said work-up station, said separating station including means for taking blanks from a stack and arranging said blanks in a row.

9. An arrangement according to claim 8, additionally comprising a stock saw upstream of said separating station for sawing the stack from a stack of slabs.

10. An arrangement according to claim 1, additionally comprising at least one grinding means.

* * * * *